(12) United States Patent
Hoshino

(10) Patent No.: US 11,644,752 B2
(45) Date of Patent: May 9, 2023

(54) POLYMER, POSITIVE RESIST COMPOSITION, AND METHOD OF FORMING RESIST PATTERN

(71) Applicant: ZEON CORPORATION, Tokyo (JP)

(72) Inventor: Manabu Hoshino, Tokyo (JP)

(73) Assignee: ZEON CORPORATION, Tokyo (JP)

( * ) Notice: Subject to any disclaimer, the term of this patent is extended or adjusted under 35 U.S.C. 154(b) by 291 days.

(21) Appl. No.: 16/468,815

(22) PCT Filed: Dec. 15, 2017

(86) PCT No.: PCT/JP2017/045204
§ 371 (c)(1),
(2) Date: Jun. 12, 2019

(87) PCT Pub. No.: WO2018/123667
PCT Pub. Date: Jul. 5, 2018

(65) Prior Publication Data
US 2020/0073240 A1 Mar. 5, 2020

(30) Foreign Application Priority Data
Dec. 27, 2016 (JP) .............................. JP2016-254084

(51) Int. Cl.
| | | |
|---|---|---|
| *G03F 7/039* | (2006.01) | |
| *G03F 7/32* | (2006.01) | |
| *C08F 212/08* | (2006.01) | |
| *C08L 25/08* | (2006.01) | |
| *C08L 27/04* | (2006.01) | |
| *C08L 27/12* | (2006.01) | |
| *G03F 7/16* | (2006.01) | |
| *G03F 7/20* | (2006.01) | |

(52) U.S. Cl.
CPC ............ *G03F 7/039* (2013.01); *C08F 212/08* (2013.01); *C08L 25/08* (2013.01); *C08L 27/04* (2013.01); *C08L 27/12* (2013.01); *G03F 7/162* (2013.01); *G03F 7/20* (2013.01); *G03F 7/32* (2013.01)

(58) Field of Classification Search
CPC ...... C08F 212/18; G03F 7/0392; G03F 7/039; G03F 7/32; C08L 25/08; C08L 27/04; C08L 27/12
See application file for complete search history.

(56) References Cited

U.S. PATENT DOCUMENTS

| | | | | |
|---|---|---|---|---|
| 4,259,407 A * | 3/1981 | Tada | ................. | G03F 7/039 428/421 |
| 4,752,635 A * | 6/1988 | Tsutsumi | ................. | G03F 7/039 524/245 |
| 6,576,400 B1 * | 6/2003 | Tamura | ................. | G03F 7/039 430/326 |
| 2002/0182541 A1 * | 12/2002 | Gonsalves | ................. | G03F 7/038 430/323 |
| 2006/0088787 A1 * | 4/2006 | Gonsalves | ................. | G03F 7/0758 528/36 |
| 2010/0203450 A1 | 8/2010 | Fujiwara et al. | | |

(Continued)

FOREIGN PATENT DOCUMENTS

| | | |
|---|---|---|
| JP | S57118243 A | 7/1982 |
| JP | S5949536 A | 3/1984 |

(Continued)

OTHER PUBLICATIONS

Jul. 2, 2019, International Preliminary Report on Patentability issued in the International Patent Application No. PCT/JP2017/045204.

Jul. 10, 2020, the Extended European Search Report issued by the European Patent Office in the corresponding European Patent Application No. 17888030.8.

\* cited by examiner

*Primary Examiner* — John S Chu
(74) *Attorney, Agent, or Firm* — Kenja IP Law PC

(57) ABSTRACT

Provided is a polymer that when used as a main chain scission-type positive resist, can sufficiently inhibit resist pattern collapse, can favorably form a clear resist pattern, and can also improve sensitivity. The polymer includes a monomer unit (A) represented by general formula (I), shown below, and a monomer unit (B) represented by general formula (II), shown below. [In formula (I), $R^1$ is an organic group including not fewer than 5 and not more than 7 fluorine atoms. In formula (II), $R^2$ is a hydrogen atom, a fluorine atom, an unsubstituted alkyl group, or a fluorine atom-substituted alkyl group, $R^3$ is a hydrogen atom, an unsubstituted alkyl group, or a fluorine atom-substituted alkyl group, p and q are each an integer of not less than 0 and not more than 5, and p+q=5.]

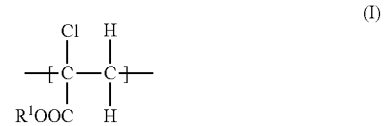

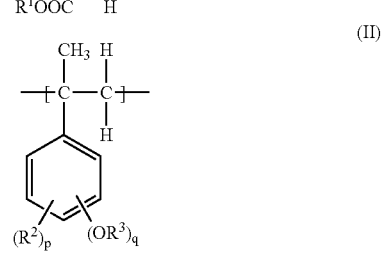

11 Claims, No Drawings

(56) References Cited

U.S. PATENT DOCUMENTS

| | | | |
|---|---|---|---|
| 2011/0183127 A1* | 7/2011 | Kodama | G03F 7/033 428/195.1 |
| 2013/0078578 A1 | 3/2013 | Iyama et al. | |
| 2015/0008211 A1 | 1/2015 | Takano et al. | |

FOREIGN PATENT DOCUMENTS

| | | |
|---|---|---|
| JP | S61170735 A | 8/1986 |
| JP | H01215812 A | 8/1989 |
| JP | H083636 B2 | 1/1996 |
| JP | 2011215243 A | 10/2011 |
| JP | 2011215244 A | 10/2011 |
| JP | 2012150443 A | 8/2012 |
| TW | 201042370 A1 | 12/2010 |
| WO | 2013018569 A1 | 2/2013 |
| WO | 2013145695 A1 | 10/2013 |

POLYMER, POSITIVE RESIST COMPOSITION, AND METHOD OF FORMING RESIST PATTERN

TECHNICAL FIELD

The present disclosure relates to a polymer, a positive resist composition, and a method of forming a resist pattern and, in particular, to a polymer that can suitably be used as a positive resist, a positive resist composition containing this polymer, and a method of forming a resist pattern using this positive resist composition.

BACKGROUND

Polymers that display increased solubility in a developer after undergoing main chain scission through irradiation with ionizing radiation, such as an electron beam, or short-wavelength light, such as ultraviolet light, are conventionally used as main chain scission-type positive resists in fields such as semiconductor production. (Hereinafter, the term "ionizing radiation or the like" is used to refer collectively to ionizing radiation and short-wavelength light.)

Patent Literature (PTL) 1 discloses one example of a main chain scission-type positive resist having high sensitivity. The disclosed positive resist comprises an α-methylstyrene-methyl α-chloroacrylate copolymer that includes an α-methylstyrene (AMS) unit and a methyl α-chloroacrylate unit.

The formation of a resist pattern using a resist film formed using a positive resist comprising an α-methylstyrene-methyl α-chloroacrylate copolymer utilizes the difference in rates of dissolution in developer of an exposed section that is irradiated with ionizing radiation or the like and a non-exposed section that is not irradiated with ionizing radiation or the like. Examples of developers that are used include alkyl group-containing carboxylic acid ester solvents such as amyl acetate and hexyl acetate, mixed liquids of isopropanol and fluorocarbons (for example, fluorine-containing solvents such as Vertrel XF® (Vertrel XF is a registered trademark in Japan, other countries, or both)), fluorocarbons (for example, fluorine-containing solvents such as Vertrel XF®) used individually, and the like (for example, refer to PTL 2 to 6).

CITATION LIST

Patent Literature

PTL 1: JP H8-3636 B
PTL 2: WO 2013/145695 A1
PTL 3: JP 2011-215243 A
PTL 4: JP 2011-215244 A
PTL 5: JP 2012-150443 A
PTL 6: WO 2013/018569 A1

SUMMARY

Technical Problem

In a formation process of a resist pattern using a resist, resist pattern collapse may occur during formation of the resist pattern through irradiation with ionizing radiation or the like and development treatment using a developer. Therefore, there is demand for the inhibition of resist pattern collapse in formation of a resist pattern using a resist.

However, it has not been possible to sufficiently inhibit resist pattern collapse through the positive resist comprising an α-methylstyrene-methyl α-chloroacrylate copolymer described in PTL 1.

Moreover, in formation of a resist pattern utilizing the difference in rates of dissolution in developer of exposed and non-exposed sections, it is necessary to increase solubility in developer of the exposed section while inhibiting dissolution in developer of the non-exposed section in order to favorably form a clear resist pattern. The solubility in developer of exposed and non-exposed sections in formation of a resist pattern using a main chain scission-type positive resist changes under the influence of properties of a polymer used as the positive resist and the type of developer.

Accordingly, there is demand for the development of a way of favorably forming a clear resist pattern using a resist composition containing a polymer that can inhibit resist pattern collapse when used as a main chain scission-type positive resist.

Solution to Problem

The inventor conducted diligent studies with the aim of achieving the objective described above. The inventor managed to inhibit resist pattern collapse in a situation in which a main chain scission-type positive resist was formed using a positive resist composition containing a polymer including a monomer unit including at least one fluorine atom, such as an α-chloroacrylic acid fluoro ester unit. However, through further studies, the inventor found that reduction in sensitivity cannot be inhibited with a resist formed using a positive resist composition containing a polymer that includes an α-chloroacrylic acid fluoro ester unit having a small number of fluorine atoms. The inventor made a new discovery that by using a positive resist composition containing a specific polymer that includes an α-chloroacrylic acid fluoro ester unit having an organic group including not fewer than 5 and not more than 7 fluorine atoms, a clear resist pattern can be favorably formed while also sufficiently inhibiting resist pattern collapse, and sensitivity can be improved. In this manner, the inventor completed the present disclosure.

Specifically, the present disclosure aims to advantageously solve the problems set forth above by disclosing a polymer comprising: a monomer unit (A) represented by general formula (I), shown below,

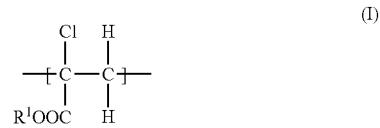

where, in general formula (I), $R^1$ is an organic group including not fewer than 5 and not more than 7 fluorine atoms; and a monomer unit (B) represented by general formula (II), shown below,

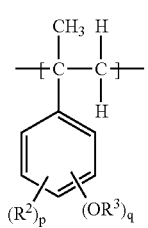

(II)

where, in general formula (II), $R^2$ is a hydrogen atom, a fluorine atom, an unsubstituted alkyl group, or a fluorine atom-substituted alkyl group, $R^3$ is a hydrogen atom, an unsubstituted alkyl group, or a fluorine atom-substituted alkyl group, p and q are each an integer of not less than 0 and not more than 5, and p+q=5. Through inclusion of a fluorine atom-containing monomer unit in the polymer, resist pattern collapse can be sufficiently inhibited and a clear resist pattern can be favorably formed when the polymer is used as a positive resist. Moreover, through inclusion of the monomer unit (A) having an organic group including not fewer than 5 and not more than 7 fluorine atoms in the polymer, sensitivity can be improved when the polymer is used as a positive resist. Therefore, the polymer including the monomer unit (A) and the monomer unit (B) can be favorably used as a main chain scission-type positive resist.

Note that in a case in which p in formula (II) is 2 or more, the plurality of $R^2$ groups may be the same or different. Likewise, in a case in which q in formula (II) is 2 or more, the plurality of $R^3$ groups may be the same or different.

In the presently disclosed polymer, $R^1$ is preferably a pentafluoroalkyl group. When $R^1$ of the monomer unit (A) is a pentafluoroalkyl group, sensitivity can be sufficiently improved while also further improving clarity of an obtained resist pattern.

Moreover, in the presently disclosed polymer, $R^1$ is preferably a 2,2,3,3,3-pentafluoropropyl group. When $R^1$ of the monomer unit (A) is a 2,2,3,3,3-pentafluoropropyl group, sensitivity can be sufficiently improved while also even further improving clarity of an obtained resist pattern.

Moreover, the present disclosure aims to advantageously solve the problems set forth above by disclosing a positive resist composition preferably comprising: any one of the polymers set forth above; and a solvent. When a positive resist composition contains the polymer set forth above as a positive resist, the positive resist composition can sufficiently inhibit resist pattern collapse when used in formation of a resist pattern, can favorably form a clear resist pattern, and can improve sensitivity.

Furthermore, the present disclosure aims to advantageously solve the problems set forth above by disclosing a method of forming a resist pattern preferably comprising: forming a resist film using the positive resist composition set forth above; exposing the resist film; and developing the resist film that has been exposed, wherein the developing is carried out using a developer having a surface tension of 17 mN/m or less. By using a developer having a surface tension of 17 mN/m or less to develop a resist film formed using the positive resist composition set forth above, resist pattern collapse can be inhibited, and a clear resist pattern can be efficiently formed.

Herein, the surface tension of a developer can be measured, for example, by the ring method at 25° C.

In the presently disclosed method of forming a resist pattern, the developer preferably comprises a fluorine-containing solvent. By using a fluorine-containing solvent in development of a resist film formed from the specific polymer described above, resist pattern collapse can be further inhibited, and the clarity of an obtained resist pattern can be further improved.

Moreover, in the presently disclosed method of forming a resist pattern, the developer is preferably $CF_3CFHCFHCF_2CF_3$. By using $CF_3CFHCFHCF_2CF_3$ as the developer, resist pattern collapse can be even further inhibited, and the clarity of an obtained resist pattern can be even further improved.

In the presently disclosed method of forming a resist pattern, development time over which the developing is carried out is preferably 1 minute to 3 minutes. When the development time is 1 minute to 3 minutes, a resist pattern can be efficiently formed and the clarity of the obtained resist pattern can be even further improved.

Advantageous Effect

The presently disclosed polymer enables provision of a main chain scission-type positive resist that can sufficiently inhibit resist pattern collapse, can favorably form a clear resist pattern, and can also improve sensitivity.

The presently disclosed positive resist composition and method of forming a resist pattern can inhibit resist pattern collapse and enable efficient formation of a good resist pattern.

DETAILED DESCRIPTION

The following provides a detailed description of embodiments of the present disclosure.

The presently disclosed polymer can be favorably used as a main chain scission-type positive resist that undergoes main chain scission to lower molecular weight upon irradiation with ionizing radiation, such as an electron beam, or short-wavelength light, such as ultraviolet light. The presently disclosed positive resist composition contains the presently disclosed polymer as a positive resist and can be used, for example, in formation of a resist pattern in a production process of a printed board such as a build-up board.

(Polymer)

The presently disclosed polymer includes: a monomer unit (A) represented by general formula (I), shown below,

(I)

(in formula (I), $R^1$ is an organic group including not fewer than 5 and not more than 7 fluorine atoms); and a monomer unit (B) represented by general formula (II), shown below,

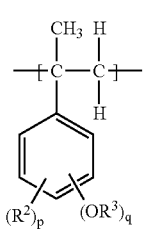

(II)

(in formula (II), $R^2$ is a hydrogen atom, a fluorine atom, an unsubstituted alkyl group, or a fluorine atom-substituted alkyl group, $R^3$ is a hydrogen atom, an unsubstituted alkyl group, or a fluorine atom-substituted alkyl group, p and q are each an integer of not less than 0 and not more than 5, and p+q=5).

Although the presently disclosed polymer may further include any monomer unit other than the monomer unit (A) and the monomer unit (B), the proportion constituted by the monomer unit (A) and the monomer unit (B), in total, among all monomer units included in the polymer is preferably 90 mol % or more, more preferably substantially 100 mol %, and even more preferably 100 mol % (i.e., the polymer even more preferably only includes the monomer unit (A) and the monomer unit (B)).

The presently disclosed polymer may be a random polymer, a block polymer, an alternating polymer (ABAB . . . ), or the like, for example, so long as the polymer includes the monomer unit (A) and the monomer unit (B). However, the presently disclosed polymer is preferably a polymer comprising 90 mass % or more (upper limit of 100 mass %) of alternating polymer. It is preferable that alternating polymer molecules do not form a crosslinked product. The inclusion of fluorine atoms in $R^1$ of monomer unit (A) inhibits formation of a crosslinked product.

Through inclusion of the specific monomer units (A) and (B), the presently disclosed polymer can undergo main chain scission to lower molecular weight upon irradiation with ionizing radiation or the like (for example, an electron beam, KrF laser, ArF laser, or EUV laser). Moreover, as a result of at least the monomer unit (A) in the presently disclosed polymer including fluorine atoms, resist pattern collapse can be sufficiently inhibited when the presently disclosed polymer is used as a resist.

Although the reason that resist pattern collapse can be inhibited through inclusion of a fluorine atom-containing monomer unit is not clear, it is presumed that as a result of liquid repellency of the polymer being enhanced, it is possible to inhibit pulling that arises between pattern sections during removal of a developer or rinsing liquid in the resist pattern formation process.

<Monomer Unit (A)>

The monomer unit (A) is a structural unit that is derived from a monomer (a) represented by general formula (III), shown below.

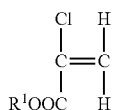

(III)

(In formula (III), $R^1$ is the same as in formula (I).)

The proportion constituted by the monomer unit (A) among all monomer units included in the polymer is not specifically limited but may, for example, be set as not less than 30 mol % and not more than 70 mol %, preferably not less than 40 mol % and not more than 60 mol %, and more preferably not less than 45 mol % and not more than 55 mol %.

$R^1$ in formulae (I) and (III) is required to be an organic group including 5 or more fluorine atoms from a viewpoint of improving main chain scission properties of the polymer upon irradiation with ionizing radiation or the like. On the other hand, $R^1$ in formulae (I) and (III) is required to be an organic group including 7 or fewer fluorine atoms, is preferably an organic group including 6 or fewer fluorine atoms, and is more preferably an organic group including 5 fluorine atoms from a viewpoint of further improving clarity of a resist pattern obtained when the presently disclosed polymer is used as a positive resist.

The carbon number of $R^1$ is preferably not less than 2 and not more than 10, is more preferably not less than 3 and not more than 4, and is even more preferably 3. Solubility in a developer may not improve if the carbon number is too small, whereas the glass-transition point may be lowered and it may not be possible to ensure pattern clarity if the carbon number is too large.

Specifically, $R^1$ in formulae (I) and (III) is preferably a fluoroalkyl group, a fluoroalkoxyalkyl group, or a fluoroalkoxyalkenyl group, and is more preferably a fluoroalkyl group.

The fluoroalkyl group is, for example, preferably a 2,2,3,3,3-pentafluoropropyl group (number of fluorine atoms: 5; carbon number: 3; structural formula X shown below), a 3,3,4,4,4-pentafluorobutyl group (number of fluorine atoms: 5; carbon number: 4; structural formula Y shown below), a 1H-1-(trifluoromethyl)trifluoroethyl group (number of fluorine atoms: 6; carbon number: 3), a 1H,1H,3H-hexafluorobutyl group (number of fluorine atoms: 6; carbon number: 4), a 2,2,3,3,4,4,4-heptafluorobutyl group (number of fluorine atoms: 7; carbon number: 4), or a 1,2,2,2-tetrafluoro-1-(trifluoromethyl)ethyl group (number of fluorine atoms: 7; carbon number: 3), and is particularly preferably a 2,2,3,3,3-pentafluoropropyl group (number of fluorine atoms: 5; carbon number: 3; structural formula X shown below).

The fluoroalkoxyalkyl group is, for example, preferably a fluoroethoxymethyl group (number of fluorine atoms: 5; carbon number: 3; structural formula Z shown below) or a fluoroethoxyethyl group (number of fluorine atoms: 5; carbon number: 4; structural formula P shown below).

The fluoroalkoxyalkenyl group is, for example, preferably a fluoroethoxyvinyl group (number of fluorine atoms: 5; carbon number: 4; structural formula Q shown below).

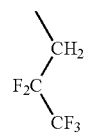

Structural formula X

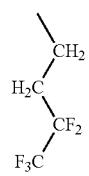

Structural formula Y

-continued

Structural formula Z
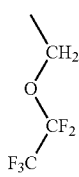

Structural formula P
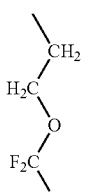

Structural formula Q
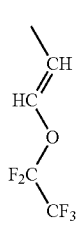

Examples of the monomer (a) represented by the previously described formula (III) that can form the monomer unit (A) represented by the previously described formula (I) include, but are not specifically limited to, fluoroalkyl esters of α-chloroacrylic acid such as 2,2,3,3,3-pentafluoropropyl α-chloroacrylate (number of fluorine atoms: 5), 3,3,4,4,4-pentafluorobutyl α-chloroacrylate (number of fluorine atoms: 5), 1H-1-(trifluoromethyl)trifluoroethyl α-chloroacrylate (number of fluorine atoms: 6), 1H,1H,3H-hexafluorobutyl α-chloroacrylate (number of fluorine atoms: 6), 1,2,2,2-tetrafluoro-1-(trifluoromethyl)ethyl α-chloroacrylate (number of fluorine atoms: 7), and 2,2,3,3,4,4,4-heptafluorobutyl α-chloroacrylate (number of fluorine atoms: 7); fluoroalkoxyalkyl esters of α-chloroacrylic acid such as pentafluoroethoxymethyl α-chloroacrylate (number of fluorine atoms: 5) and pentafluoroethoxyethyl α-chloroacrylate (number of fluorine atoms: 5); and fluoroalkoxyalkenyl esters of α-chloroacrylic acid such as pentafluoroethoxyvinyl α-chloroacrylate (number of fluorine atoms: 5).

<Monomer Unit (B)>

The monomer unit (B) is a structural unit that is derived from a monomer (b) represented by general formula (IV), shown below.

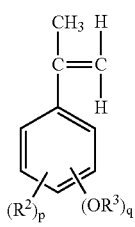

(IV)

(In formula (IV), $R^2$, $R^3$, p, and q are the same as in formula (II).)

The proportion constituted by the monomer unit (B) among all monomer units included in the polymer is not specifically limited but may, for example, be set as not less than 30 mol % and not more than 70 mol %, preferably not less than 40 mol % and not more than 60 mol %, and more preferably not less than 45 mol % and not more than 55 mol %.

Examples of fluorine atom-substituted alkyl groups that may form $R^2$ and $R^3$ in formulae (II) and (IV) include, but are not specifically limited to, groups having a structure in which all or some of the hydrogen atoms of an alkyl group are replaced by fluorine atoms.

Examples of unsubstituted alkyl groups that may form $R^2$ and $R^3$ in formulae (II) and (IV) include, but are not specifically limited to, unsubstituted alkyl groups having a carbon number of not less than 1 and not more than 5. Of such alkyl groups, a methyl group or an ethyl group is preferable as an unsubstituted alkyl group that may form $R^2$ and $R^3$.

From a viewpoint of improving ease of production of the polymer, the plurality of $R^2$ and/or $R^3$ groups that are present in formulae (II) and (IV) are each preferably a hydrogen atom or an unsubstituted alkyl group, more preferably a hydrogen atom or an unsubstituted alkyl group having a carbon number of not less than 1 and not more than 5, and even more preferably a hydrogen atom.

Note that in formulae (II) and (IV), from a viewpoint of improving ease of production of the polymer, it is preferable that p is 5, q is 0, and the five $R^2$ groups are each a hydrogen atom or an unsubstituted alkyl group, more preferable that the five $R^2$ groups are each a hydrogen atom or an unsubstituted alkyl group having a carbon number of not less than 1 and not more than 5, and even more preferable that the five $R^2$ groups are each a hydrogen atom.

Moreover, from a viewpoint of solubility in a developer, it is preferable that one fluorine atom is included in any one of the plurality of $R^2$ and $R^3$ groups present in formulae (II) and (IV).

On the other hand, from a viewpoint of further inhibiting resist pattern collapse when the polymer is used in formation of a resist pattern, the plurality of $R^2$ and/or $R^3$ groups that are present in formulae (II) and (IV) preferably include a fluorine atom or a fluorine atom-substituted alkyl group, and more preferably include a fluorine atom or a fluorine atom-substituted alkyl group having a carbon number of not less than 1 and not more than 5.

Examples of the monomer (b) represented by the previously described formula (IV) that may be used to form the monomer unit (B) represented by the previously described formula (II) include, but are not specifically limited to, α-methylstyrene (AMS) and derivatives thereof (for example, 4-fluoro-α-methylstyrene (4FAMS)) such as (b-1) to (b-11), shown below.

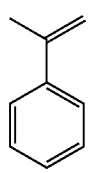
(b-1)

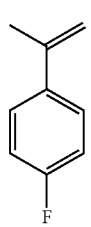
(b-2)

-continued (b-3) 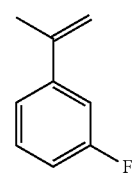

(b-4) 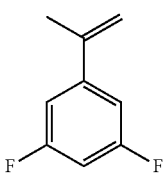

(b-5) 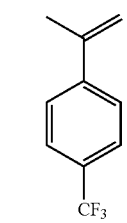

(b-6) 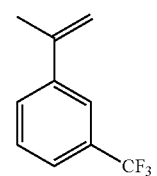

(b-7) 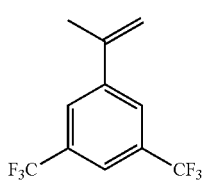

(b-8) 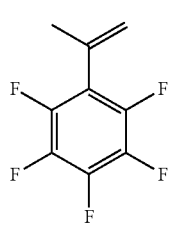

(b-9) 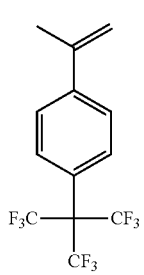

-continued (b-10) 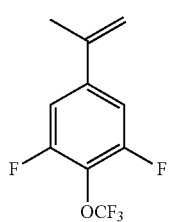

(b-11) 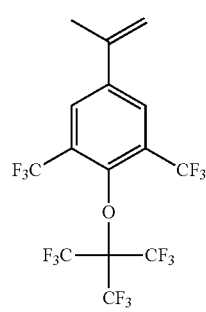

Note that from a viewpoint of improving ease of production of the polymer, the monomer unit (B) preferably does not include a fluorine atom (i.e., preferably only the monomer unit (A) includes fluorine atoms), and is more preferably a structural unit derived from α-methylstyrene. In other words, it is particularly preferable that for $R^2$, $R^3$, p, and q in formulae (II) and (IV), p=5, q=0, and all five $R^2$ groups are hydrogen atoms. Moreover, from a viewpoint of solubility in a developer, it is preferable that the monomer unit (B) includes one fluorine. In other words, it is particularly preferable that for $R^2$, $R^3$, p, and q in formulae (II) and (IV), p=5, q=0, and one fluorine atom is included in any one of the five $R^2$ groups.

(Properties of Polymer)

<Weight-Average Molecular Weight>

The weight-average molecular weight (Mw) of the presently disclosed polymer is preferably 20,000 or more, more preferably 25,000 or more, and particularly preferably 40,000 or more, and is preferably 50,000 or less. When the weight-average molecular weight (Mw) of the polymer is 20,000 or more, it is possible to inhibit increased resist film solubility in a developer through an excessively low irradiation dose and inhibit excessive reduction of clarity.

<Number-Average Molecular Weight>

The number-average molecular weight (Mn) of the presently disclosed polymer is preferably 20,000 or more, more preferably 25,000 or more, and particularly preferably 28,000 or more, and is preferably 37,000 or less. When the number-average molecular weight (Mn) of the polymer is 20,000 or more, it is possible to inhibit increased resist film solubility in a developer through an excessively low irradiation dose and inhibit excessive reduction of clarity.

<Molecular Weight Distribution>

The molecular weight distribution (Mw/Mn) of the presently disclosed polymer is preferably 1.25 or more, and more preferably 1.30 or more, and is preferably 1.65 or less, and more preferably 1.60 or less. The polymer is easier to produce when the molecular weight distribution (Mw/Mn) of the polymer is 1.25 or more. Moreover, clarity when the polymer is used as a positive resist can be increased and clarity of an obtained resist pattern can be increased when the molecular weight distribution (Mw/Mn) of the polymer is 1.65 or less.

<Surface Free Energy>

The surface free energy of a film prepared using the presently disclosed polymer is preferably 15 mJ/m$^2$ or more, more preferably 20 mJ/m$^2$ or more, and particularly preferably 21 mJ/m$^2$ or more, and is preferably 30 mJ/m$^2$ or less, more preferably 25 mJ/m$^2$ or less, and particularly preferably 24.5 mJ/m$^2$ or less. When the surface free energy is 15 mJ/m$^2$ or more, it is possible to select a developer or rinsing liquid that ensures wettability. Moreover, when the surface free energy is 30 mJ/m$^2$ or less, an irradiated region can be selectively dissolved.

The surface free energy of the polymer (crude) can be calculated by measuring the contact angle of two solvents (water and diiodomethane) for which surface tension, a polar component (p), and a dispersive force component (d) are known using a goniometer under subsequently described conditions, and then evaluating the surface free energy by the Owens-Wendt method (extended Fowkes model).

(Production Method of Polymer)

The polymer including the monomer unit (A) and the monomer unit (B) set forth above can be produced, for example, by carrying out polymerization of a monomer composition that contains the monomer (a) and the monomer (b), and then optionally purifying the obtained polymerized product.

The composition, molecular weight distribution, weight-average molecular weight, and number-average molecular weight of the polymer can be adjusted by altering the polymerization conditions and the purification conditions. In one specific example, the composition of the polymer can be adjusted by altering the percentage content of each monomer in the monomer composition used in polymerization. In another example, the weight-average molecular weight and the number-average molecular weight can be reduced by raising the polymerization temperature. In yet another example, the weight-average molecular weight and the number-average molecular weight can be reduced by shortening the polymerization time.

<Polymerization of Monomer Composition>

The monomer composition used in production of the presently disclosed polymer may be a mixture containing a monomer component that includes the monomer (a) and the monomer (b), an optional solvent, a polymerization initiator, and optionally added additives. Polymerization of the monomer composition may be carried out by a known method. In particular, in a case in which a solvent is used, it is preferable that cyclopentanone or the like is used as the solvent. Moreover, it is preferable that a radical polymerization initiator such as azobisisobutyronitrile is used as the polymerization initiator. Note that the weight-average molecular weight and the number-average molecular weight of the polymer can also be adjusted by altering the amount of the polymerization initiator that is used. Specifically, the weight-average molecular weight and the number-average molecular weight can be increased by using a smaller amount of the polymerization initiator and, conversely, can be reduced by using a larger amount of the polymerization initiator.

A polymerized product obtained through polymerization of the monomer composition may be used as the polymer as obtained or may, without any specific limitations, be collected by adding a good solvent such as tetrahydrofuran to a solution containing the polymerized product and subsequently dripping the solution to which the good solvent has been added into a poor solvent such as methanol to coagulate the polymerized product, and then the polymerized product may be purified as described below.

<Purification of Polymerized Product>

The method of purification in a case in which the obtained polymerized product is purified may be, but is not specifically limited to, a known purification method such as re-precipitation or column chromatography. Of these purification methods, purification by re-precipitation is preferable.

Note that purification of the polymerized product may be performed repeatedly.

Purification of the polymerized product by re-precipitation is, for example, preferably carried out by dissolving the resultant polymerized product in a good solvent such as tetrahydrofuran, and subsequently dripping the resultant solution into a mixed solvent of a good solvent, such as tetrahydrofuran, and a poor solvent, such as methanol, to precipitate a portion of the polymerized product. When purification of the polymerized product is carried out by dripping a solution of the polymerized product into a mixed solvent of a good solvent and a poor solvent as described above, the molecular weight distribution, weight-average molecular weight, and number-average molecular weight of the resultant polymer can easily be adjusted by altering the types or mixing ratio of the good solvent and the poor solvent. In one specific example, the molecular weight of polymer that precipitates in the mixed solvent can be increased by increasing the proportion of the good solvent in the mixed solvent.

Also note that in a situation in which the polymerized product is purified by re-precipitation, polymerized product that precipitates in the mixed solvent of the good solvent and the poor solvent may be used as the presently disclosed polymer, or polymerized product that does not precipitate in the mixed solvent (i.e., polymerized product dissolved in the mixed solvent) may be used as the presently disclosed polymer. Polymerized product that does not precipitate in the mixed solvent can be collected from the mixed solvent by a known technique such as concentration to dryness.

(Positive Resist Composition)

The presently disclosed positive resist composition contains the polymer set forth above and a solvent, and may optionally further contain known additives that can be included in resist compositions. As a result of the presently disclosed positive resist composition containing the polymer set forth above as a positive resist, the positive resist composition can sufficiently inhibit resist pattern collapse when used in formation of a resist pattern, can favorably form a clear resist pattern, and can also improve sensitivity.

<Solvent>

The solvent may be any known solvent in which the above-described polymer is soluble. Of such solvents, an n-pentyl ester of an organic acid, an n-hexyl ester of an organic acid, or a mixture thereof is preferable, n-pentyl acetate, n-hexyl acetate, or a mixture thereof is more preferable, and n-hexyl acetate is even more preferable from a viewpoint of obtaining a positive resist composition having appropriate viscosity and improving coatability of the positive resist composition.

(Method of Forming Resist Pattern)

The presently disclosed method of forming a resist pattern uses the positive resist composition set forth above. Specifically, the presently disclosed method of forming a resist pattern includes (1) a step of forming a resist film using the presently disclosed positive resist composition (resist film formation step), (2) a step of exposing the resist film (exposure step), and (3) a step of developing the resist film that has been exposed (development step). The presently disclosed method of forming a resist pattern may optionally further include a rinsing step of removing a developer after the development step. A feature of the presently disclosed method of forming a resist pattern is that the development step is carried out using a developer having a surface tension of 17 mN/m or less. As a result of a resist film containing the polymer including the monomer unit (A) and the monomer unit (B) set forth above being developed using a developer having a surface tension of 17 mN/m or less in the presently disclosed method of forming a resist pattern, the presently disclosed method of forming a resist pattern enables favorable and efficient formation of a clear resist pattern while sufficiently inhibiting resist pattern collapse.

<Resist Film Formation Step>

In step (1), the presently disclosed positive resist composition is applied onto a workpiece, such as a substrate, that is to be processed using a resist pattern, and the applied positive resist composition is dried to form a resist film. No specific limitations are placed on the application method and the drying method, and known application methods and drying methods may be adopted.

<Exposure Step>

In step (2), the resist film is irradiated with ionizing radiation or light to write a desired pattern. Irradiation with ionizing radiation or light can be carried out using a known writing device such as an electron beam writer or a laser writer.

<Development Step>

In step (3), the resist film that has been exposed in the exposure step and a developer are brought into contact to develop the resist film and form a resist pattern on the workpiece.

The method by which the resist film and the developer are brought into contact may be, but is not specifically limited to, a method using a known technique such as immersion of the resist film in the developer or application of the developer onto the resist film.

[[Developer]]

The developer used in the presently disclosed method of forming a resist pattern is required to have a surface tension of 17 mN/m or less. The surface tension of the developer is preferably 16.5 mN/m or less, and more preferably 15 mN/m or less. Although a resist film formed using the presently disclosed positive resist composition has low surface energy, when the surface tension of the developer is 17 mN/m or less, the developer readily enters into fine gaps even when the development target is a fine resist pattern. The boiling point of the developer is preferably 63° C. or lower, and more preferably 60° C. or lower. When the boiling point of the developer is 63° C. or lower, drying is simple and the necessity of a rinsing step can be eliminated.

The developer having a surface tension of 17 mN/m or less may, for example, be a fluorine-containing solvent such as $CF_3CFHCFHCF_2CF_3$ (surface tension: 14.1 mN/m), $CF_3CF_2CHCl_2$ (surface tension: 16.2 mN/m), $CClF_2CF_2CHClF$ (surface tension: 16.2 mN/m), $CF_3CF_2CF_2CF_2OCH_3$ (surface tension: 13.6 mN/m), $C_8F_{18}$ (surface tension: 13.6 mN/m), $C_4F_9OC_2H_5$ (surface tension: 13.6 mN/m), $C_2F_5CF(OCH_3)C_3F_7$ (surface tension: 15.1 mN/m), or a mixture thereof, of which, $CF_3CFHCFHCF_2CF_3$ is preferable. In selection of a fluorine-containing solvent that can be used as the developer, it is preferable to select a fluorine-containing solvent in which the resist film does not dissolve prior to the exposure step. Moreover, so long as the surface tension of the developer is 17 mN/m or less, a mixture of a solvent having a surface tension of more than 17 mN/m and a solvent having a surface tension of 17 mN/m or less may be used. Examples of solvents that can be mixed include alcohols such as methanol, ethanol, 1-propanol, and 2-propanol (isopropyl alcohol); and alkyl group-containing acetic acid esters such as amyl acetate and hexyl acetate. So long as the surface tension of the overall developer is 17 mN/m or less, these solvents in which solubility of a resist film formed using the polymer set forth above varies may be mixed so as to achieve a balance of ease of infiltration into fine gaps in a resist pattern and solubility of the resist film. On the other hand, the use of a single solvent is advantageous in terms of ease of recovery and reuse. Moreover, it is preferable that an SP value of the developer is 6.2 to 7.3. When the SP value of the developer is 6.2 to 7.3, polymer can be quickly dissolved and a clear pattern can be formed. In a case in which a mixture of a plurality of solvents including a fluorine-containing solvent is used as the developer, the proportion constituted by the fluorine-containing solvent relative to the overall developer is preferably more than 50 volume %, more preferably more than 75 volume %, even more preferably 90 volume % or more, and particularly preferably 95 volume % or more.

The optionally used rinsing liquid may be, but is not specifically limited to, a known rinsing liquid that is selected in accordance with the type of developer that is used. Moreover, in selection of the rinsing liquid, it is preferable to select a rinsing liquid that readily mixes with the developer such that the developer is readily replaced by the rinsing liquid. For example, in a case in which $CF_3CFHCFHCF_2CF_3$ is used as the developer, although it is not necessary to use a rinsing liquid, hydrofluoroether or the like may be used as a rinsing liquid.

The temperature of the developer is not specifically limited and may, for example, be set as not lower than 21° C. and not higher than 25° C.

[[Development Conditions]]

The development conditions can be set as appropriate in order to obtain a resist pattern of desired quality.

The development time can be determined as appropriate by the method of determining development conditions described above. The specific development time is preferably not less than 1 minute and not more than 4 minutes, more preferably not less than 1 minute and not more than 3 minutes, and particularly preferably not less than 2 minutes and not more than 3 minutes in a case in which a developer having a surface tension of 17 mN/m or less such as $CF_3CFHCFHCF_2CF_3$ is used as the developer.

By setting the development time within the preferable range or the more preferable range in this manner, a clear resist pattern can be favorably and efficiently formed while sufficiently inhibiting resist pattern collapse.

EXAMPLES

The following provides a more specific description of the present disclosure based on examples. However, the present disclosure is not limited to the following examples. In the following description, "%" and "parts" used in expressing quantities are by mass, unless otherwise specified.

In the examples and comparative examples, the following methods were used to measure and evaluate the weight-average molecular weight, number-average molecular weight, and molecular weight distribution of a polymer (crude), the surface free energy of a film prepared using the polymer (crude), and the pattern collapse resistance, Eth, and γ value (clarity) of a positive resist formed from the polymer (crude).

<Weight-Average Molecular Weight, Number-Average Molecular Weight, and Molecular Weight Distribution>

The weight-average molecular weight (Mw) and number-average molecular weight (Mn) of an obtained polymer (crude) were measured by gel permeation chromatography, and then the molecular weight distribution (Mw/Mn) of the polymer (crude) was calculated. Specifically, the weight-average molecular weight (Mw) and number-average molecular weight (Mn) of the polymer (crude) were determined as values in terms of standard polystyrene using a gel permeation chromatograph (HLC-8220 produced by Tosoh Corporation) with tetrahydrofuran as a developing solvent. The molecular weight distribution (Mw/Mn) was then calculated.

<Surface Free Energy>

Under conditions described below, a goniometer (Drop Master 700 produced by Kyowa Interface Science Co., Ltd.) was used to measure the contact angle of two solvents (water and diiodomethane) for which surface tension, a polar component (p), and a dispersive force component (d) were known with a film prepared by a method described below using an obtained polymer (crude). Surface free energy was evaluated by the Owens-Wendt method (extended Fowkes model) to calculate the surface free energy of the polymer (crude). The measurement conditions in contact angle measurement were as described below.

<<Preparation Method of Film>>

A spin coater (MS-A150 produced by Mikasa Co., Ltd.) was used to apply a positive resist composition onto a silicon wafer of 4 inches in diameter such as to have a thickness of 500 nm. The applied positive resist composition was heated for 3 minutes by a hot-plate having a temperature of 180° C. to form a film on the silicon wafer.

<<Measurement Conditions in Contact Angle Measurement>>

Needle: Metal needle 22G (water), Teflon® (Teflon is a registered trademark in Japan, other countries, or both) coated needle 22G (diiodomethane)

Wait time: 1,000 ms

Liquid volume: 1.8 μL

Liquid landing recognition: water 50 dat; diiodomethane 100 dat Temperature: 23° C.

Example 1

<Production of Polymer (Crude)>

A monomer composition containing 3.0 g of 2,2,3,3,3-pentafluoropropyl α-chloroacrylate (ACAPFP) as monomer (a), 3.4764 g of α-methylstyrene (AMS) as monomer (b), 0.0055 g of azobisisobutyronitrile as a polymerization initiator, and 1.6205 g of cyclopentanone as a solvent was added into a glass container. The glass container was tightly sealed and purged with nitrogen, and was then stirred for 6 hours in a 78° C. thermostatic tank under a nitrogen atmosphere. Thereafter, the glass container was returned to room temperature, the inside of the glass container was exposed to the atmosphere, and then 10 g of tetrahydrofuran (THF) was added to the resultant solution. The solution to which the THF had been added was then dripped into 300 g of methanol to precipitate a polymerized product. Thereafter, the solution containing the polymerized product that had precipitated was filtered using a Kiriyama funnel to obtain a white coagulated material (polymer; crude). The weight-average molecular weight, number-average molecular weight, and molecular weight distribution of the obtained polymer (crude) were measured. Moreover, the surface free energy of a film prepared using the obtained polymer (crude) was measured. The results are shown in Table 1-1. The obtained polymer (crude) comprised 50 mol % of 2,2,3,3,3-pentafluoropropyl α-chloroacrylate units and 50 mol % of α-methyl styrene units.

<Production of Positive Resist Composition>

The obtained polymer (crude) was dissolved in n-hexyl acetate serving as a solvent to produce a resist solution (positive resist composition) in which the concentration of the polymer (crude) was 4 mass %. The pattern collapse resistance, γ value, and Eth of a positive resist film formed from the polymer (crude) were evaluated as described below. The results are shown in Table 1-1.

<Pattern Collapse Resistance of Resist Film>

A spin coater (MS-A150 produced by Mikasa Co., Ltd.) was used to apply the positive resist composition onto a silicon wafer of 4 inches in diameter. Next, the applied positive resist composition was heated for 3 minutes by a hot-plate having a temperature of 180° C. to form a resist film of 50 nm in thickness on the silicon wafer. An electron beam writer (ELS-S50 produced by Elionix Inc.) was used to write a pattern through exposure of the resist film to an optimal exposure dose (Eop). Development treatment was subsequently carried out for 1 minute at a temperature of 23° C. using a fluorine-containing solvent (produced by Du Pont-Mitsui Fluorochemicals Co., Ltd.; Vertrel XF®; $CF_3CFHCFHCF_2CF_3$) having a surface tension of 14.1 as a resist developer. Thereafter, the resist developer was dried by blowing to form a resist pattern. The occurrence of pattern collapse of the formed resist pattern was inspected. Note that the optimal exposure dose (Eop) was set as appropriate with a value approximately double Eth as a rough guide. Lines (non-exposed regions) and spaces (exposed regions) of the resist pattern were each set as 20 nm.

Pattern collapse resistance was evaluated in accordance with the following standard.

A: Pattern collapse not observed

B: Pattern collapse observed

<γ Value of Resist Film>

A spin coater (MS-A150 produced by Mikasa Co., Ltd.) was used to apply the positive resist composition onto a silicon wafer of 4 inches in diameter such as to have a thickness of 500 nm. The applied positive resist composition was heated for 3 minutes by a hot-plate having a temperature of 180° C. to form a resist film on the silicon wafer. An electron beam writer (ELS-S50 produced by Elionix Inc.) was used to write a plurality of patterns (dimensions: 500 μm×500 μm) over the resist film with different electron beam irradiation doses, and development treatment was carried out for 1 minute at a temperature of 23° C. using a fluorine-containing solvent (produced by Du Pont-Mitsui Fluorochemicals Co., Ltd.; Vertrel XF®; $CF_3CFHCFHCF_2CF_3$) having a surface tension of 14.1 mN/m as a resist developer. The electron beam irradiation dose was varied in a range of 4 μC/cm² to 200 μC/cm² in increments of 4 μC/cm². Next, an optical film thickness meter (Lambda Ace produced by Dainippon Screen Mfg. Co., Ltd.) was used to measure the thickness of the resist film in regions in which writing had been performed. A sensitivity curve was prepared that indicated a relationship between the common logarithm of the total electron beam irradiation dose and the remaining film fraction of the resist film after development (=thickness of resist film after development/thickness of resist film formed on silicon wafer). The γ value was determined from the obtained sensitivity curve (horizontal axis: common logarithm of total electron beam irradiation dose; vertical axis: remaining film fraction of resist film (0 remaining film fraction≤1.00)) using the formula shown below. In the following formula, $E_0$ is the logarithm of the total irradiation dose obtained when the sensitivity curve is fitted to a quadratic function in a range from a remaining film fraction of 0.20 to a remaining film fraction of 0.80, and then a remaining film fraction of 0 is substituted with respect to the obtained quadratic function (function of remaining film fraction and common logarithm of total irradiation dose). Also, $E_1$ is the logarithm of the total irradiation dose obtained when a straight line is prepared that joins points on the obtained quadratic function corresponding to remaining film fractions of 0 and 0.50 (linear approximation for gradient of sensitivity curve), and then a remaining film fraction of 1.00 is substituted with respect to the obtained straight line (function of remaining film fraction and common logarithm of total irradiation dose). The following formula expresses the gradient of the straight line between a remaining film fraction of 0 and a remaining film fraction of 1.00.

$$\gamma = \left| \log_{10}\left(\frac{E_1}{E_0}\right) \right|^{-1}$$

A larger γ value indicates that the sensitivity curve has a larger gradient and that a pattern having high clarity can be more favorably formed.

<Eth>

A resist film was formed on a silicon wafer in the same way as in the evaluation method for the γ value of a resist film. The initial thickness T0 of the resultant resist film was measured using an optical film thickness meter (Lambda Ace produced by Dainippon Screen Mfg. Co., Ltd.). Moreover, the total electron beam irradiation dose Eth (μC/cm$^2$) was determined for a point at which the remaining film fraction was 0 on the straight line (linear approximation of sensitivity curve gradient) obtained in calculation of the γ value. A smaller value for Eth indicates higher resist film sensitivity and higher resist pattern formation efficiency.

Example 2

A positive resist composition was produced and each evaluation was performed in the same way as in Example 1 with the exception that instead of using the polymer (crude) in Example 1, a polymer obtained by purifying the polymer (crude) as described below was used. The results are shown in Table 1-1.

[Purification of Polymer (Crude)]

The obtained polymer (crude) was subsequently dissolved in 100 g of THF and the resultant solution was dripped into a mixed solvent of 150 g of THF and 850 g of methanol (MeOH) to precipitate a white coagulated material (polymer including α-methylstyrene units and 2,2,3,3,3-pentafluoropropyl α-chloroacrylate units). Thereafter, the solution containing the polymer that had precipitated was filtered using a Kiriyama funnel to obtain a white polymer. The weight-average molecular weight, number-average molecular weight, and molecular weight distribution of the obtained polymer were measured. Moreover, the surface free energy of a film prepared using the obtained polymer was measured. The results are shown in Table 1-1.

Example 2-2

A polymer and a positive resist composition were produced and each evaluation was performed in the same way as in Example 2 with the exception that instead of forming a resist pattern through development treatment without rinsing in Example 2, a resist pattern was formed by performing 10 s of rinsing using hydrofluoroether after development treatment. The results are shown in Table 1-1.

Example 3

A positive resist composition was produced and each evaluation was performed in the same way as in Example 1 with the exception that production of a polymer (crude) in Example 1 was carried out as described below. The results are shown in Table 1-1.

<Production of Polymer (Crude)>

A monomer composition containing 3.0 g of 2,2,3,3,4,4,4-heptafluorobutyl α-chloroacrylate as monomer (a), 2.8738 g of α-methylstyrene as monomer (b), 0.0046 g of azobisisobutyronitrile as a polymerization initiator, and 1.4696 g of cyclopentanone as a solvent was added into a glass container. The glass container was tightly sealed and purged with nitrogen, and was then stirred for 6 hours in a 78° C. thermostatic tank under a nitrogen atmosphere. Thereafter, the glass container was returned to room temperature, the inside of the glass container was exposed to the atmosphere, and then 10 g of tetrahydrofuran (THF) was added to the resultant solution. The solution to which the THF had been added was then dripped into 300 g of methanol to precipitate a polymerized product. Thereafter, the solution containing the polymerized product that had precipitated was filtered using a Kiriyama funnel to obtain a white coagulated material (polymer; crude). The weight-average molecular weight, number-average molecular weight, and molecular weight distribution of the obtained polymer (crude) were measured. Moreover, the surface free energy of a film prepared using the obtained polymer (crude) was measured. The results are shown in Table 1-1. The obtained polymer (crude) comprised 50 mol % of 2,2,3,3,4,4,4-heptafluorobutyl α-chloroacrylate units and 50 mol % of α-methylstyrene units.

Example 4

A positive resist composition was produced and each evaluation was performed in the same way as in Example 3 with the exception that instead of using the polymer (crude) in Example 3, a polymer obtained by purifying the polymer (crude) as described below was used. The results are shown in Table 1-1.

[Purification of Polymer (Crude)]

The obtained polymer (crude) was subsequently dissolved in 100 g of THF and the resultant solution was dripped into a mixed solvent of 100 g of THF and 900 g of methanol (MeOH) to precipitate a white coagulated material (polymer including α-methylstyrene units and 2,2,3,3,4,4,4-heptafluorobutyl α-chloroacrylate units). Thereafter, the solution containing the polymer that had precipitated was filtered using a Kiriyama funnel to obtain a white polymer. The weight-average molecular weight, number-average molecular weight, and molecular weight distribution of the obtained polymer were measured. Moreover, the surface free energy of a film prepared using the obtained polymer was measured. The results are shown in Table 1-1.

Example 5

A positive resist composition was produced and each evaluation was performed in the same way as in Example 1 with the exception that production of a polymer (crude) was carried out as described below instead of using the polymer (crude) produced in Example 1. The results are shown in Table 1-1.

<Production of Polymer (Crude)>

A monomer composition containing 3.0 g of 2,2,3,3,3-pentafluoropropyl α-chloroacrylate (ACAPFP) as monomer (a), 3.23483 g of 4-fluoro-α-methylstyrene (4FAMS) as monomer (b), and 0.00521 g of azobisisobutyronitrile as a polymerization initiator was added into a glass container. The glass container was tightly sealed and purged with nitrogen, and was then stirred for 6 hours in a 78° C. thermostatic tank under a nitrogen atmosphere. Thereafter, the glass container was returned to room temperature, the inside of the glass container was exposed to the atmosphere, and then 10 g of tetrahydrofuran (THF) was added to the resultant solution. The solution to which the THF had been added was then dripped into 300 g of methanol to precipitate a polymerized product. Thereafter, the solution containing the polymerized product that had precipitated was filtered using a Kiriyama funnel to obtain a white coagulated material (polymer; crude). The weight-average molecular weight, number-average molecular weight, and molecular weight distribution of the obtained polymer (crude) were measured. Moreover, the surface free energy of a film prepared using the obtained polymer (crude) was measured. The results are shown in Table 1-1. The obtained polymer (crude) comprised 50 mol % of 2,2,3,3,3-pentafluoropropyl α-chloroacrylate units and 50 mol % of 4-fluoro-α-methylstyrene units.

Example 6

A positive resist composition was produced and each evaluation was performed in the same way as in Example 5 with the exception that instead of using the polymer (crude) in Example 5, a polymer obtained by purifying the polymer (crude) as described below was used. The results are shown in Table 1-1.

[Purification of Polymer (Crude)]

The obtained polymer (crude) was subsequently dissolved in 100 g of THF and the resultant solution was dripped into a mixed solvent of 50 g of THF and 950 g of methanol (MeOH) to precipitate a white coagulated material (polymer including 4-fluoro-α-methyl styrene units and 2,2,3,3,3-pentafluoropropyl α-chloroacrylate units). Thereafter, the solution containing the polymer that had precipitated was filtered using a Kiriyama funnel to obtain a white polymer. The weight-average molecular weight, number-average molecular weight, and molecular weight distribution of the obtained polymer were measured. Moreover, the surface free energy of a film prepared using the obtained polymer was measured. The results are shown in Table 1-1.

Comparative Example 1

A positive resist composition was produced and each evaluation was performed in the same way as in Example 1 with the exception that a polymer of methyl α-chloroacrylate (ACAM) and α-methylstyrene produced by the method described below was used instead of the polymer (crude) produced in Example 1 and anisole was used instead of n-hexyl acetate as a solvent in production of the positive resist composition. The results are shown in Table 1-2.

<Production of Polymer>

A monomer composition containing 3.0 g of methyl α-chloroacrylate and 6.88 g of α-methylstyrene as monomers, 2.47 g of cyclopentanone as a solvent, and 0.01091 g of azobisisobutyronitrile as a polymerization initiator was added into a glass container. The glass container was tightly sealed and purged with nitrogen, and was then stirred for 6.5 hours in a 78° C. thermostatic tank under a nitrogen atmosphere. Thereafter, the glass container was returned to room temperature, the inside of the glass container was exposed to the atmosphere, and then 30 g of tetrahydrofuran (THF) was added to the resultant solution. The solution to which the THF had been added was then dripped into 300 g of methanol to precipitate a polymerized product. Thereafter, the solution containing the polymerized product that had precipitated was filtered using a Kiriyama funnel to obtain a white coagulated material (polymer). The weight-average molecular weight, number-average molecular weight, and molecular weight distribution of the obtained polymer (crude) were measured. Moreover, the surface free energy of a film prepared using the obtained polymer (crude) was measured. The results are shown in Table 1-2. The obtained polymer comprised 50 mol % of α-methylstyrene units and 50 mol % of methyl α-chloroacrylate units.

Comparative Example 2

A positive resist composition was produced and each evaluation was performed in the same way as in Example 1 with the exception that a polymer of methyl α-chloroacrylate (ACAM) and α-methylstyrene produced in the same way as in Comparative Example 1 was used instead of the polymer (crude) produced in Example 1, anisole was used instead of n-hexyl acetate as a solvent in production of the positive resist composition, and isopropyl alcohol (IPA) was used instead of the fluorine-containing solvent as a developer. The results are shown in Table 1-2.

Comparative Example 3

A positive resist composition was produced and each evaluation was performed in the same way as in Example 1 with the exception that production of a polymer (crude) was carried out as described below instead of using the polymer (crude) produced in Example 1, anisole was used instead of n-hexyl acetate as a solvent in production of the positive resist composition, and n-amyl acetate was used instead of the fluorine-containing solvent as a developer. The results are shown in Table 1-2.

<Production of Polymer (Crude)>

A monomer composition containing 3.0 g of methyl α-fluoroacrylate (AFAM) as monomer (a), 7.9674 g of α-methylstyrene as monomer (b), and 0.0126 g of azobisisobutyronitrile as a polymerization initiator was added into a glass container. The glass container was tightly sealed and purged with nitrogen, and was then stirred for 6 hours in a 78° C. thermostatic tank under a nitrogen atmosphere. Thereafter, the glass container was returned to room temperature, the inside of the glass container was exposed to the atmosphere, and then 10 g of tetrahydrofuran (THF) was added to the resultant solution. The solution to which the THF had been added was then dripped into 300 g of methanol to precipitate a polymerized product. Thereafter, the solution containing the polymerized product that had precipitated was filtered using a Kiriyama funnel to obtain a white coagulated material (polymer; crude). The weight-average molecular weight, number-average molecular weight, and molecular weight distribution of the obtained polymer (crude) were measured. Moreover, the surface free energy of a film prepared using the obtained polymer (crude)

was measured. The results are shown in Table 1-2. The obtained polymer (crude) comprised 50 mol % of methyl α-fluoroacrylate units and 50 mol % of α-methylstyrene units.

Comparative Example 4

A positive resist composition was produced and each evaluation was performed in the same way as in Comparative Example 3 with the exception that instead of using the polymer (crude) in Comparative Example 3, a polymer obtained by purifying the polymer (crude) as described below was used. The results are shown in Table 1-2.
[Purification of Polymer (Crude)]
The obtained polymer (crude) was subsequently dissolved in 100 g of THF and the resultant solution was dripped into a mixed solvent of 500 g of THF and 500 g of methanol (MeOH) to precipitate a white coagulated material (polymer including α-methylstyrene units and methyl α-fluoroacrylate units). Thereafter, the solution containing the polymer that had precipitated was filtered using a Kiriyama funnel to obtain a white polymer. The obtained white polymer was dissolved in 100 g of THF and the resultant solution was dripped into a mixed solvent of 575 g of THF and 425 g of methanol (MeOH) to precipitate a white coagulated material (polymer including α-methyl styrene units and methyl α-fluoroacrylate units). Thereafter, the solution containing the polymer that had precipitated was filtered using a Kiriyama funnel, and the filtrate was concentrated to dryness to obtain a white polymer. The weight-average molecular weight, number-average molecular weight, and molecular weight distribution of the obtained polymer were measured. Moreover, the surface free energy of a film prepared using the obtained polymer was measured. The results are shown in Table 1-2.

Comparative Example 5

A positive resist composition was produced and each evaluation was performed in the same way as in Example 1 with the exception that production of a polymer (crude) was carried out as described below instead of using the polymer (crude) produced in Example 1 and propylene glycol methyl ether acetate (PGMEA) was used instead of n-hexyl acetate as a solvent in production of the positive resist composition. The results are shown in Table 1-2.
<Production of Polymer (Crude)>
A monomer composition containing 3.0 g of trifluoroethyl α-chloroacrylate (ACATFE) as monomer (a), 4.3985 g of α-methylstyrene as monomer (b), 0.007 g of azobisisobutyronitrile as a polymerization initiator, and 1.8514 g of cyclopentanone as a solvent was added into a glass container. The glass container was tightly sealed and purged with nitrogen, and was then stirred for 6 hours in a 78° C. thermostatic tank under a nitrogen atmosphere. Thereafter, the glass container was returned to room temperature, the inside of the glass container was exposed to the atmosphere, and then 10 g of tetrahydrofuran (THF) was added to the resultant solution. The solution to which the THF had been added was then dripped into 300 g of methanol to precipitate a polymerized product. Thereafter, the solution containing the polymerized product that had precipitated was filtered using a Kiriyama funnel to obtain a white coagulated material (polymer; crude). The weight-average molecular weight, number-average molecular weight, and molecular weight distribution of the obtained polymer (crude) were measured. Moreover, the surface free energy of a film prepared using the obtained polymer (crude) was measured. The results are shown in Table 1-2. The obtained polymer (crude) comprised 50 mol % of trifluoroethyl α-chloroacrylate units and 50 mol % of α-methylstyrene units.

Comparative Example 6

A positive resist composition was produced and each evaluation was performed in the same way as in Comparative Example 5 with the exception that instead of using the polymer (crude) in Comparative Example 5, a polymer obtained by purifying the polymer (crude) as described below was used. The results are shown in Table 1-2.
[Purification of Polymer (Crude)]
The obtained polymer (crude) was subsequently dissolved in 100 g of THF and the resultant solution was dripped into a mixed solvent of 150 g of THF and 850 g of methanol (MeOH) to precipitate a white coagulated material (polymer including α-methylstyrene units and trifluoroethyl α-chloroacrylate units). Thereafter, the solution containing the polymer that had precipitated was filtered using a Kiriyama funnel to obtain a white polymer. The weight-average molecular weight, number-average molecular weight, and molecular weight distribution of the obtained polymer were measured. Moreover, the surface free energy of a film prepared using the obtained polymer was measured. The results are shown in Table 1-2.

Comparative Example 7

A positive resist composition was produced and each evaluation was performed in the same way as in Example 1 with the exception that production of a polymer (crude) was carried out as described below instead of using the polymer (crude) produced in Example 1, propylene glycol methyl ether acetate (PGMEA) was used instead of n-hexyl acetate as a solvent in production of the positive resist composition, and isopropyl alcohol (IPA) was used instead of the fluorine-containing solvent as a developer. The results are shown in Table 1-2.
<Production of Polymer (Crude)>
A monomer composition containing 3.0 g of trifluoroethyl α-chloroacrylate (ACATFE) as monomer (a), 4.3985 g of α-methylstyrene as monomer (b), 0.007 g of azobisisobutyronitrile as a polymerization initiator, and 1.8514 g of cyclopentanone as a solvent was added into a glass container. The glass container was tightly sealed and purged with nitrogen, and was then stirred for 6 hours in a 78° C. thermostatic tank under a nitrogen atmosphere. Thereafter, the glass container was returned to room temperature, the inside of the glass container was exposed to the atmosphere, and then 10 g of tetrahydrofuran (THF) was added to the resultant solution. The solution to which the THF had been added was then dripped into 300 g of methanol to precipitate a polymerized product. Thereafter, the solution containing the polymerized product that had precipitated was filtered using a Kiriyama funnel to obtain a white coagulated material (polymer; crude). The weight-average molecular weight, number-average molecular weight, and molecular weight distribution of the obtained polymer (crude) were measured. Moreover, the surface free energy of a film prepared using the obtained polymer (crude) was measured. The results are shown in Table 1-2. The obtained polymer (crude) comprised 50 mol % of trifluoroethyl α-chloroacrylate units and 50 mol % of α-methylstyrene units.

Comparative Example 8

A positive resist composition was produced and each evaluation was performed in the same way as in Comparative Example 7 with the exception that instead of using the polymer (crude) in Comparative Example 7, a polymer obtained by purifying the polymer (crude) as described below was used. The results are shown in Table 1-2.

[Purification of Polymer (Crude)]

The obtained polymer (crude) was subsequently dissolved in 100 g of THF and the resultant solution was dripped into a mixed solvent of 150 g of THF and 850 g of methanol (MeOH) to precipitate a white coagulated material (polymer including α-methylstyrene units and trifluoroethyl α-chloroacrylate units). Thereafter, the solution containing the polymer that had precipitated was filtered using a Kiriyama funnel to obtain a white polymer. The weight-average molecular weight, number-average molecular weight, and molecular weight distribution of the obtained polymer were measured. Moreover, the surface free energy of a film prepared using the obtained polymer was measured. The results are shown in Table 1-2.

Examples 1-A to 1-D

A polymer (crude) and a positive resist composition were produced and each evaluation was performed in the same way as in Example 1 with the exception that the development time was set as 2 minutes, 3 minutes, 4 minutes, or 5 minutes instead of the development time of 1 minute in Example 1. The results are shown in Table 2.

Examples 2-A to 2-D

A polymer and a positive resist composition were produced and each evaluation was performed in the same way as in Example 2 with the exception that the development time was set as 2 minutes, 3 minutes, 4 minutes, or 5 minutes instead of the development time of 1 minute in Example 2. The results are shown in Table 3.

Examples 5-A to 5-D

A polymer (crude) and a positive resist composition were produced and each evaluation was performed in the same way as in Example 5 with the exception that the development time was set as 2 minutes, 3 minutes, 4 minutes, or 5 minutes instead of the development time of 1 minute in Example 5. The results are shown in Table 4.

Examples 6-A to 6-D

A polymer (crude) and a positive resist composition were produced and each evaluation was performed in the same way as in Example 6 with the exception that the development time was set as 2 minutes, 3 minutes, 4 minutes, or 5 minutes instead of the development time of 1 minute in Example 6. The results are shown in Table 5.

TABLE 1-1

|  |  | Example 1 | Example 2 | Example 2-2 | Example 3 |
|---|---|---|---|---|---|
| Polymer | Monomer (a) | ACAPFP | ACAPFP | ACAPFP | 2,2,3,3,4,4,4-Heptafluorobutyl α-chloroacrylate |
|  | No. of F atoms in $R^1$ | 5 | 5 | 5 | 7 |
|  | Monomer (b) | AMS | AMS | AMS | AMS |
|  | Number-average molecular weight (Mn) [-] | 29853 | 36136 | 36136 | 28913 |
|  | Weight-average molecular weight (Mw) [-] | 46772 | 49486 | 49486 | 43232 |
|  | Molecular weight distribution (Mw/Mn) [-] | 1.567 | 1.369 | 1.369 | 1.495 |
|  | Surface free energy [mJ/m$^2$] | 24.2 | 24.2 | 24.2 | 21 |
|  | Solvent used in purification | No purification | THF/MeOH (mass ratio 15:85) | THF/MeOH (mass ratio 15:85) | No purification |
|  | Solvent used in resist composition production | Hexyl acetate | Hexyl acetate | Hexyl acetate | Hexyl acetate |
| Developer | Developer | Fluorine-containing solvent | Fluorine-containing solvent | Fluorine-containing solvent | Fluorine-containing solvent |
|  | Surface tension [mN/m] | 14.1 | 14.1 | 14.1 | 14.1 |
| Rinsing | Rinsing liquid | No rinsing | No rinsing | Hydrofluoroether | No rinsing |
| Evaluation | Pattern collapse resistance | A | A | A | A |
|  | Eth [μC/cm$^2$] | 77.351 | 84.879 | 83.500 | 28.9 |
|  | γ Value [-] | 15.555 | 22.293 | 22.000 | 5.3 |

|  |  |  | Example 4 | Example 5 | Example 6 |
|---|---|---|---|---|---|
| Polymer | Monomer (a) |  | 2,2,3,3,4,4,4-Heptafluorobutyl α-chloroacrylate | ACAPFP | ACAPFP |
|  | No. of F atoms in $R^1$ |  | 7 | 5 | 5 |
|  | Monomer (b) |  | AMS | 4FAMS | 4FAMS |
|  | Number-average molecular weight (Mn) [-] |  | 35123 | 28601 | 36477 |
|  | Weight-average molecular weight (Mw) [-] |  | 46563 | 40546 | 47603 |
|  | Molecular weight distribution (Mw/Mn) [-] |  | 1.326 | 1.418 | 1.305 |
|  | Surface free energy [mJ/m$^2$] |  | 21 | 22.2 | 22.2 |

TABLE 1-1-continued

| | | | | |
|---|---|---|---|---|
| | Solvent used in purification | THF/MeOH (mass ratio 10:90) | No purification | THF/MeOH (mass ratio 5:95) |
| | Solvent used in resist composition production | Hexyl acetate | Hexyl acetate | Hexyl acetate |
| Developer | Developer | Fluorine-containing solvent | Fluorine-containing solvent | Fluorine-containing solvent |
| | Surface tension [mN/m] | 14.1 | 14.1 | 14.1 |
| Rinsing | Rinsing liquid | No rinsing | No rinsing | No rinsing |
| Evaluation | Pattern collapse resistance | A | A | A |
| | Eth [μC/cm$^2$] | 32.2 | 76.250 | 76.872 |
| | γ Value [-] | 6.5 | 18.622 | 20.083 |

TABLE 1-2

| | | Comparative Example 1 | Comparative Example 2 | Comparative Example 3 | Comparative Example 4 | Comparative Example 5 |
|---|---|---|---|---|---|---|
| Polymer | Monomer (a) | ACAM | ACAM | AFAM | AFAM | ACATFE |
| | No. of F atoms in R$^1$ | 0 | 0 | 0 | 0 | 3 |
| | Monomer (b) | AMS | AMS | AMS | AMS | AMS |
| | Number-average molecular weight (Mn) [-] | 29409 | 29409 | 23064 | 35609 | 31303 |
| | Weight-average molecular weight (Mw) [-] | 54541 | 54541 | 54004 | 48427 | 50883 |
| | Molecular weight distribution (Mw/Mn) [-] | 1.85 | 1.85 | 2.341 | 1.360 | 1.625 |
| | Surface free energy [mJ/m$^2$] | 44.5 | 44.5 | 43.1 | 43.1 | 29.8 |
| | Solvent used in purification | — | — | No purification | THF/MeOH (mass ratio 57.5:42.5) | No purification |
| | Solvent used in resist composition production | Anisole | Anisole | Anisole | Anisole | PGMEA |
| Developer | Developer | Fluorine-containing solvent | IPA | n-Amyl acetate | n-Amyl acetate | Fluorine-containing solvent |
| | Surface tension [mN/m] | 14.1 | 20.8 | 25.7 | 25.7 | 14.1 |
| Rinsing | Rinsing liquid | No rinsing | No rinsing | No rinsing | No rinsing | No rinsing |
| Evaluation | Pattern collapse resistance | A | B | B | B | A |
| | Eth [μC/cm$^2$] | 1200 | 770 | 212.905 | 264.351 | 274.219 |
| | γ Value [-] | 40 | 35 | 3.368 | 3.919 | 40.977 |

| | | Comparative Example 6 | Comparative Example 7 | Comparative Example 8 |
|---|---|---|---|---|
| Polymer | Monomer (a) | ACATFE | ACATFE | ACATFE |
| | No. of F atoms in R$^1$ | 3 | 3 | 3 |
| | Monomer (b) | AMS | AMS | AMS |
| | Number-average molecular weight (Mn) [-] | 46824 | 31303 | 46824 |
| | Weight-average molecular weight (Mw) [-] | 64383 | 50883 | 64383 |
| | Molecular weight distribution (Mw/Mn) [-] | 1.375 | 1.625 | 1.375 |
| | Surface free energy [mJ/m$^2$] | 29.8 | 29.8 | 29.8 |
| | Solvent used in purification | THF/MeOH (mass ratio 15:85) | No purification | THF/MeOH (mass ratio 15:85) |
| | Solvent used in resist composition production | PGMEA | PGMEA | PGMEA |
| Developer | Developer | Fluorine-containing solvent | IPA | IPA |
| | Surface tension [mN/m] | 14.1 | 20.8 | 20.8 |
| Rinsing | Rinsing liquid | No rinsing | No rinsing | No rinsing |
| Evaluation | Pattern collapse resistance | A | B | B |
| | Eth [μC/cm$^2$] | 274.037 | 194.217 | 195.325 |
| | γ Value [-] | 52.158 | 33.170 | 42.221 |

TABLE 2

|  |  | Example 1 | Example 1-A | Example 1-B | Example 1-C | Example 1-D |
|---|---|---|---|---|---|---|
| Polymer | Monomer (a) | ACAPFP | ACAPFP | ACAPFP | ACAPFP | ACAPFP |
|  | Monomer (b) | AMS | AMS | AMS | AMS | AMS |
|  | Solvent used in purification | No purification | No purification | No purification | No purification | No purification |
| Development | Developer | Fluorine-containing solvent | Fluorine-containing solvent | Fluorine-containing solvent | Fluorine-containing solvent | Fluorine-containing solvent |
|  | Surface tension of developer [mN/m] | 14.1 | 14.1 | 14.1 | 14.1 | 14.1 |
|  | Development time [min] | 1 | 2 | 3 | 4 | 5 |
| Evaluation | Pattern collapse resistance | A | A | A | A | A |
|  | Eth [μC/cm$^2$] | 77.351 | 72.663 | 68.205 | 64.313 | 60.407 |
|  | γ Value [-] | 15.555 | 25.688 | 23.414 | 17.768 | 18.033 |

TABLE 3

|  |  | Example 2 | Example 2-A | Example 2-B | Example 2-C | Example 2-D |
|---|---|---|---|---|---|---|
| Polymer | Monomer (a) | ACAPFP | ACAPFP | ACAPFP | ACAPFP | ACAPFP |
|  | Monomer (b) | AMS | AMS | AMS | AMS | AMS |
|  | Solvent used in purification | THF/MeOH (mass ratio 15:85) | THF/MeOH (mass ratio 15:85) | THF/MeOH (mass ratio 15:85) | THF/MeOH (mass ratio 15:85) | THF/MeOH (mass ratio 15:85) |
| Development | Developer | Fluorine-containing solvent | Fluorine-containing solvent | Fluorine-containing solvent | Fluorine-containing solvent | Fluorine-containing solvent |
|  | Surface tension of developer [mN/m] | 14.1 | 14.1 | 14.1 | 14.1 | 14.1 |
|  | Development time [min] | 1 | 2 | 3 | 4 | 5 |
| Evaluation | Pattern collapse resistance | A | A | A | A | A |
|  | Eth [μC/cm$^2$] | 84.879 | 80.509 | 72.536 | 68.297 | 68.220 |
|  | γ Value [-] | 22.293 | 29.667 | 27.941 | 24.955 | 15.575 |

TABLE 4

|  |  | Example 5 | Example 5-A | Example 5-B | Example 5-C | Example 5-D |
|---|---|---|---|---|---|---|
| Polymer | Monomer (a) | ACAPFP | ACAPFP | ACAPFP | ACAPFP | ACAPFP |
|  | Monomer (b) | 4FAMS | 4FAMS | 4FAMS | 4FAMS | 4FAMS |
|  | Solvent used in purification | No purification | No purification | No purification | No purification | No purification |
| Development | Developer | Fluorine-containing solvent | Fluorine-containing solvent | Fluorine-containing solvent | Fluorine-containing solvent | Fluorine-containing solvent |
|  | Surface tension of developer [mN/m] | 14.1 | 14.1 | 14.1 | 14.1 | 14.1 |
|  | Development time [min] | 1 | 2 | 3 | 4 | 5 |
| Evaluation | Pattern collapse resistance | A | A | A | A | A |
|  | Eth [μC/cm$^2$] | 76.250 | 64.287 | 60.494 | 60.311 | 56.644 |
|  | γ Value [-] | 18.622 | 19.999 | 18.822 | 15.713 | 15.257 |

TABLE 5

|  |  | Example 6 | Example 6-A | Example 6-B | Example 6-C | Example 6-D |
|---|---|---|---|---|---|---|
| Polymer | Monomer (a) | ACAPFP | ACAPFP | ACAPFP | ACAPFP | ACAPFP |
|  | Monomer (b) | 4FAMS | 4FAMS | 4FAMS | 4FAMS | 4FAMS |
|  | Solvent used in purification | THF/MeOH (mass ratio 5:95) | THF/MeOH (mass ratio 5:95) | THF/MeOH (mass ratio 5:95) | THF/MeOH (mass ratio 5:95) | THF/MeOH (mass ratio 5:95) |

TABLE 5-continued

|  |  | Example 6 | Example 6-A | Example 6-B | Example 6-C | Example 6-D |
|---|---|---|---|---|---|---|
| Development | Developer | Fluorine-containing solvent | Fluorine-containing solvent | Fluorine-containing solvent | Fluorine-containing solvent | Fluorine-containing solvent |
|  | Surface tension of developer [mN/m] | 14.1 | 14.1 | 14.1 | 14.1 | 14.1 |
|  | Development time [min] | 1 | 2 | 3 | 4 | 5 |
| Evaluation | Pattern collapse resistance | A | A | A | A | A |
|  | Eth [μC/cm$^2$] | 76.872 | 68.218 | 64.534 | 60.334 | 56.324 |
|  | γ Value [-] | 20.083 | 21.607 | 20.236 | 19.150 | 18.923 |

It can be seen from Tables 1-1 and 1-2, shown above, that a clear resist pattern can be favorably formed while sufficiently inhibiting resist pattern collapse and also improving sensitivity when a specific polymer having an organic group including not fewer than 5 and not more than 7 fluorine atoms is used, which demonstrates that this polymer can be favorably used as a main chain scission-type positive resist.

It can also be seen from Tables 1-1 and 1-2, shown above, that resist pattern collapse can be inhibited and a clear resist pattern can be efficiently formed when a resist film formed using the above-described positive resist composition is developed using a developer having a surface tension of 17 mN/m or less.

Moreover, it can be seen from Tables 2 to 5, shown above, that in a case in which a resist film formed using the above-described positive resist composition is developed using a developer having a surface tension of 17 mN/m or less, a resist pattern can be efficiently formed and clarity of the obtained resist pattern can be further improved when the development time is 1 minute to 3 minutes.

INDUSTRIAL APPLICABILITY

The presently disclosed polymer enables provision of a main chain scission-type positive resist that can sufficiently inhibit resist pattern collapse, can favorably form a clear resist pattern, and can also improve sensitivity.

The presently disclosed positive resist composition and method of forming a resist pattern can inhibit resist pattern collapse and enable efficient formation of a good resist pattern.

The invention claimed is:

1. A main chain scission-type positive resist composition comprising a polymer and a solvent, the polymer comprising:
a monomer unit (A) represented by general formula (I), shown below,

(I)

where, in general formula (I), R$^1$ is an organic group including not fewer than 5 and not more than 7 fluorine atoms; and
a monomer unit (B) represented by general formula (II), shown below,

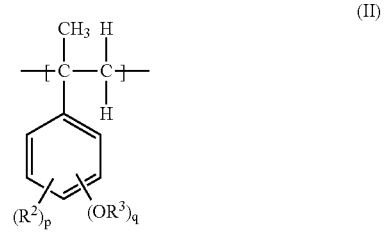

(II)

where, in general formula (II), R$^2$ is a hydrogen atom, a fluorine atom, an unsubstituted alkyl group, or a fluorine atom-substituted alkyl group, R$^3$ is a hydrogen atom, an unsubstituted alkyl group, or a fluorine atom-substituted alkyl group, p and q are each an integer of not less than 0 and not more than 5, and p+q=5, wherein
a proportion constituted by the monomer unit (A) and the monomer unit (B), in total, among all monomer units included in the polymer is 90 mol % or more,
the proportion constituted by the monomer unit (A) is not less than 40 mol % and not more than 60 mol %, and
the proportion constituted by the monomer unit (B) is not less than 40 mol % and not more than 60 mol %, wherein
molecular weight distribution is 1.25 or more and 1.65 or less, wherein
surface free energy of a film prepared using the polymer is 15 mJ/m$^2$ or more and 30 mJ/m$^2$ or less.

2. The main chain scission-type positive resist composition according to claim 1, wherein R$^1$ is a pentafluoroalkyl group.

3. The main chain scission-type positive resist composition according to claim 1, wherein R$^1$ is a 2,2,3,3,3-pentafluoropropyl group.

4. A method of forming a resist pattern comprising:
forming a resist film using the main chain scission-type positive resist composition according to claim 1;
exposing the resist film; and
developing the resist film that has been exposed, wherein
the developing is carried out using a developer having a surface tension of 17 mN/m or less.

5. The method of forming a resist pattern according to claim 4, wherein the developer comprises a fluorine-containing solvent.

6. The method of forming a resist pattern according to claim 5, wherein the developer is CF$_3$CFHCFHCF$_2$CF$_3$.

7. The method of forming a resist pattern according to claim 4, wherein development time over which the developing is carried out is 1 minute to 3 minutes.

8. The main chain scission-type positive resist composition according to claim 1, wherein weight-average molecular weight is 20,000 or more and 50,000 or less.

9. The main chain scission-type positive resist composition according to claim 1, wherein the polymer comprises 90 mass % or more of an alternating polymer.

10. The main chain scission-type positive resist composition according to claim 1, wherein the unsubstituted alkyl group has a carbon number of not less than 1 and not more than 5.

11. The main chain scission-type positive resist composition according to claim 1, wherein one fluorine atom is included in any one of $R^2$ and $R^3$ groups.

* * * * *